United States Patent
Huang et al.

(10) Patent No.: US 9,739,960 B2
(45) Date of Patent: Aug. 22, 2017

(54) OPTICAL MODULE HEAT DISSIPATION STRUCTURE AND ELECTRONIC PRODUCT

(71) Applicant: Huawei Technologies Co., Ltd., Shenzhen (CN)

(72) Inventors: Shuliang Huang, Shenzhen (CN); Zaomeng Liu, Shenzhen (CN); Liqian Zhai, Yokohama (JP)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 13 days.

(21) Appl. No.: 14/980,458

(22) Filed: Dec. 28, 2015

(65) Prior Publication Data
US 2016/0109670 A1    Apr. 21, 2016

Related U.S. Application Data

(63) Continuation of application No. PCT/CN2014/074959, filed on Apr. 9, 2014.

(30) Foreign Application Priority Data

Nov. 20, 2013  (CN) .......................... 2013 1 0589282

(51) Int. Cl.
*H05K 7/20* (2006.01)
*G02B 6/42* (2006.01)

(52) U.S. Cl.
CPC ......... *G02B 6/4272* (2013.01); *G02B 6/4269* (2013.01); *G02B 6/4271* (2013.01); *H05K 7/2039* (2013.01); *H05K 7/2049* (2013.01)

(58) Field of Classification Search
CPC ... H01L 23/473; G02B 6/4272; G02B 6/4269; G02B 6/4271; H05K 7/2039; H05K 7/2049
See application file for complete search history.

(56) References Cited

U.S. PATENT DOCUMENTS

| 6,081,424 A | 6/2000 | Mach et al. |
| 2005/0162761 A1 | 7/2005 | Hargis et al. |

(Continued)

FOREIGN PATENT DOCUMENTS

| CN | 1652677 A | 8/2005 |
| CN | 1691443 A | 11/2005 |

(Continued)

OTHER PUBLICATIONS

Foreign Communication From a Counterpart Application, PCT Application No. PCT/CN2014/074959, English Translation of International Search Report dated Jul. 30, 2014, 2 pages.

(Continued)

*Primary Examiner* — Robert J Hoffberg
*Assistant Examiner* — Hung Dang
(74) *Attorney, Agent, or Firm* — Conley Rose, P.C.

(57) ABSTRACT

An optical module heat dissipation structure, disposed inside an enclosure, where the optical module heat dissipation structure includes an optical module, an elastic component, a fixed wall, and a heat dissipation wall, where the fixed wall and the heat dissipation wall are both connected to the enclosure, the optical module is disposed between the fixed wall and the heat dissipation wall, the elastic component elastically abuts between the fixed wall and the optical module, and elasticity of the elastic component makes the optical module tightly cling to the heat dissipation wall, to improve the heat dissipation efficiency of the optical module heat dissipation structure. An electronic product is further provided where the electronic product includes the optical module heat dissipation structure.

16 Claims, 2 Drawing Sheets

(56) References Cited

U.S. PATENT DOCUMENTS

| | | |
|---|---|---|
| 2005/0238074 A1 | 10/2005 | Matsushita et al. |
| 2008/0186681 A1 | 8/2008 | Deck et al. |
| 2012/0045181 A1 | 2/2012 | Ishii et al. |
| 2013/0176748 A1 | 7/2013 | Shaw et al. |

FOREIGN PATENT DOCUMENTS

| | | |
|---|---|---|
| CN | 102375187 A | 3/2012 |
| CN | 102798092 A | 11/2012 |
| CN | 102958323 A | 3/2013 |
| DE | 10154878 A1 | 5/2003 |
| EP | 0858106 A1 | 8/1998 |
| WO | 2012126748 A1 | 9/2012 |

OTHER PUBLICATIONS

Foreign Communication From a Counterpart Application, PCT Application No. PCT/CN2014/074959, Written Opinion dated Jul. 30, 2014, 4 pages.

Foreign Communication From a Counterpart Application, European Application No. 14864147.5, Extended European Search Report dated Jul. 20, 2016, 9 pages.

Foreign Communication From a Counterpart Application, Chinese Application No. 2013105892829, Chinese Search Report dated Aug. 9, 2016, 2 pages.

Foreign Communication From a Counterpart Application, Chinese Application No. 2013105892829, Chinese Office fiction dated Sep. 27, 2016, 5 pages.

OPTICAL MODULE HEAT DISSIPATION STRUCTURE AND ELECTRONIC PRODUCT

CROSS-REFERENCE TO RELATED APPLICATIONS

This application is a continuation of International Application No. PCT/CN2014/074959, filed on Apr. 9, 2014, which claims priority to Chinese Patent Application No. 201310589282.9, filed on Nov. 20, 2013, both of which are hereby incorporated by reference in their entireties.

TECHNICAL FIELD

The present disclosure relates to the field of optical communications, and in particular, to an optical module heat dissipation structure and an electronic product having the optical module heat dissipation structure.

BACKGROUND

In a communications device, to adapt to different heights of electronic devices on a board inside a product, an upper cover and a bottom shell are provided with many raised structures, and the electronic devices need to dissipate heat by clinging to the shell. Because the devices need to uniformly dissipate heat by clinging to the shell on a same plane, a certain clearance tolerance is caused. Due to this clearance tolerance, a heat conducting material having a large thickness needs to be coated on a surface of a device, to conduct heat to an enclosure for heat dissipation. In the field of optical communications, many products use optical modules for data transmission. An optical module, for example, a transmitter optical subassembly (TOSA), is installed between an upper cover and a bottom shell. A high density of the optical module causes a relatively large gap between the optical module and the upper cover or the bottom shell, and a heat conducting material is needed to fill the gap. Because the heat conducting material also has a very large thermal resistance, a heat dissipation requirement of the optical module cannot be well satisfied, reducing the service life of the optical module.

SUMMARY

The present disclosure is used to solve the problem in the prior art that a heat conducting material cannot satisfy a heat dissipation requirement of an optical module due to a large gap between the optical module and an enclosure of a product. The present disclosure provides an optical module heat dissipation structure, which can reduce a clearance tolerance between an optical module and an enclosure, and improve heat transfer efficiency.

To achieve the foregoing objective, implementation manners of the present disclosure provide the following technical solutions.

According to an aspect, the present disclosure provides an optical module heat dissipation structure, disposed inside an enclosure, where the optical module heat dissipation structure includes an optical module, an elastic component, a fixed wall, and a heat dissipation wall, where the fixed wall and the heat dissipation wall are both connected to the enclosure, the optical module is disposed between the fixed wall and the heat dissipation wall, the elastic component elastically abuts between the fixed wall and the optical module, and elasticity of the elastic component makes the optical module tightly cling to the heat dissipation wall, to improve the heat dissipation efficiency of the optical module heat dissipation structure.

In a first possible implementation manner, a joint portion is provided at a front end of the optical module, a first lamination portion is provided at a back end of the optical module, the joint portion penetrates the fixed wall, and the first lamination portion tightly clings to the heat dissipation wall.

With reference to the first possible implementation manner, in second possible implementation manner, the top of the optical module further includes a second lamination portion, where the second lamination portion tightly clings to the enclosure.

With reference to the second possible implementation manner, in a third possible implementation manner, the enclosure is a metal material.

With reference to the first possible implementation manner, in a fourth possible implementation manner, a heat conducting material is coated between the first lamination portion and the heat dissipation wall.

In a fifth possible implementation manner, a heat pipe is further included, where the heat pipe is embedded in the heat dissipation wall and conducts heat dissipated from the optical module, to the enclosure.

With reference to the fifth possible implementation manner, in a sixth possible implementation manner, the heat pipe includes a first part and a second part, where an insertion slot is formed between the heat dissipation wall and the enclosure, the second part of the heat pipe is accommodated inside the insertion slot, and the first part of the heat pipe is clamped between the optical module and the heat dissipation wall.

With reference to the sixth possible implementation manner, in a seventh possible implementation manner, the heat pipe is L-shaped.

In an eighth possible implementation manner, the optical module heat dissipation structure further includes a thermoelectric cooling module, where the thermoelectric cooling module includes a control portion and a chip, the control portion is electrically connected to a circuit card in the enclosure, the chip is fixed between the heat dissipation wall and the enclosure, and the chip includes a cold side and a hot side, where the cold side is laminated to the heat dissipation wall, and the hot side is laminated to the enclosure.

In a ninth possible implementation manner, the elastic component includes a first abutting portion, a second abutting portion, and a connection portion, where the connection portion is connected between the first abutting portion and the second abutting portion, the first abutting portion is configured to abut against the fixed wall, the second abutting portion is configured to abut against the optical module, and an open slot is provided on the first abutting portion and the second abutting portion, where a joint portion is provided at a front end of the optical module, and the joint portion is accommodated inside the open slots and penetrates the fixed wall.

In a tenth possible implementation manner, the elastic component includes a pair of springs, where a joint portion is provided at a front end of the optical module, each of the springs presses between the fixed wall and the optical module, the joint portion penetrates the fixed wall, and the pair of springs are symmetrically distributed on two sides of the joint portion.

According to another aspect, the present disclosure further provides an electronic product, and the electronic product includes an enclosure and the optical module heat dissipation structure, which is disposed inside the enclosure, according to any one of the foregoing implementation manners.

According to the optical module heat dissipation structure and the electronic product provided in the present disclosure, elasticity of an elastic component makes an optical module tightly cling to a heat dissipation wall, and makes the optical module be in contact with the heat dissipation wall connected to an enclosure, so as to improve a heat dissipation effect of the optical module, thereby satisfying a heat dissipation requirement of the optical module, and increasing the service life of the optical module.

BRIEF DESCRIPTION OF DRAWINGS

To describe the technical solutions in the embodiments of the present disclosure more clearly, the following briefly introduces the accompanying drawings required for describing the embodiments. The accompanying drawings in the following description show merely some embodiments of the present disclosure, and a person of ordinary skill in the art may still derive other drawings from these accompanying drawings without creative efforts.

DESCRIPTION OF EMBODIMENTS

The following clearly describes the technical solutions in the implementation manners of the present disclosure with reference to the accompanying drawings in the implementation manners of the present disclosure.

Figure 1:
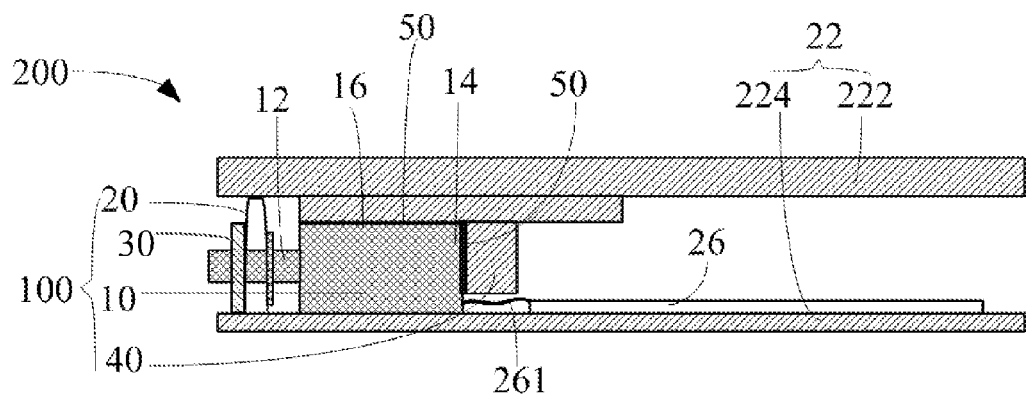
FIG. 1 is a schematic diagram of an optical module heat dissipation structure disposed inside an electronic product according to an implementation manner of the present disclosure.

As shown in FIG. 1, the present disclosure provides an optical module heat dissipation structure 100, applied to an electronic product 200, where the optical module heat dissipation structure 100 is disposed inside an enclosure 22 of the electronic product 200. The optical module heat dissipation structure 100 includes an optical module 10, an elastic component 20, a fixed wall 30, and a heat dissipation wall 40, where the fixed wall 30 and the heat dissipation wall 40 are both connected to the enclosure 22, the optical module 10 is disposed between the fixed wall 30 and the heat dissipation wall 40, the elastic component 20 elastically abuts between the fixed wall 30 and the optical module 10, and elasticity of the elastic component 20 makes the optical module 10 tightly cling to the heat dissipation wall 40, to improve the heat dissipation efficiency of the optical module heat dissipation structure 100. The optical module 20 may be a TOSA.

According to the optical module heat dissipation structure 100 and the electronic product 200 provided in the present disclosure, elasticity of the elastic component 20 makes the optical module 10 tightly cling to the heat dissipation wall 40, and makes the optical module 10 be in contact with the heat dissipation wall 40 connected to the enclosure 22, so as to improve a heat dissipation effect of the optical module 10, thereby satisfying a heat dissipation requirement of the optical module 10, and increasing the service life of the optical module 10.

In this implementation manner, a joint portion 12 is provided at a front end of the optical module 10, a first lamination portion 14 is provided at a back end of the optical module 10, the joint portion 12 penetrates the fixed wall 30 to extend out of the enclosure 22, the joint portion 12 extends out of the enclosure 22 of the electronic product 200 for implementing signal transmission with another external electronic product, and the first lamination portion 14 tightly clings to the heat dissipation wall 40. In the present disclosure, a rear part of the optical module 10 tightly clings to the heat dissipation wall 40 for heat dissipation, and the elastic component 20 is installed at the fixed wall 30 used for the joint portion 12 at the front end to extend out. That is, the fixed wall 30 has both functions of positioning the joint portion 12 and installing the elastic component 20. Therefore, the optical module heat dissipation structure 100 of the present disclosure is simple and reduces costs of the electronic product 200 provided in the present disclosure.

Further, the enclosure 22 includes an upper housing 222 and a lower housing 224, where the fixed wall 30 extends from the lower housing 224 towards the inside of the enclosure 22, and the heat dissipation wall 40 extends from the upper housing 222 towards the inside of the enclosure 22. The optical module 10 further includes a second lamination portion 16, where the second lamination portion 16 tightly clings to the upper housing 222. The second lamination portion 16 is disposed on the top of the optical module 10, and a material having good heat dissipation performance, for example, metal or a ceramic material having good conducting performance, is selected for the upper housing 222. The heat dissipation wall 40 and the upper housing 222 are integrally formed, the second lamination portion 16 on the top of the optical module 10 and the first lamination portion 14 at the back end are perpendicular to each other, and the heat dissipation wall 40 is perpendicular to an inner surface of the upper housing 222, such that tightly laminated structures can be formed both between the top of the optical module 10 and the upper housing 222, and between the back end of the optical module 10 and the heat dissipation wall 40. The electronic product 200 further includes a circuit card 26, where the circuit card 26 is connected to the lower housing 224, and the back end of the optical module 10 is electrically connected to the circuit card 26 by a wire 261.

In this implementation manner, a heat conducting material 50 is coated between the first lamination portion 14 and the heat dissipation wall 40. Because the first lamination portion 14 is in surface contact with the heat dissipation wall 40, after the first lamination portion 14 and the heat dissipation wall 40 tightly cling to each other, due to planeness, there is a very small gap between the two. The heat conducting material 50 is thin, and is coated between the first lamination portion 14 and the heat dissipation wall 40 to reduce interfacial thermal resistance, thereby improving the heat dissipation performance. Similarly, the heat conducting material 50 is also coated between the second lamination portion 16 and the upper housing 222.

Figure 2:
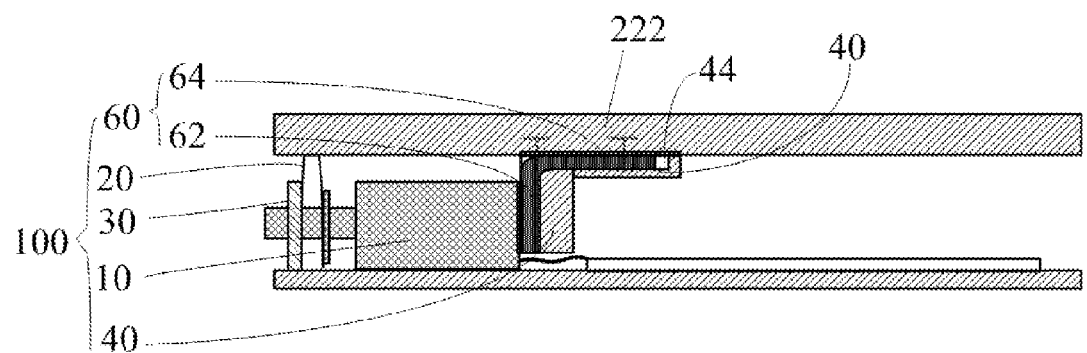
FIG. 2 is a schematic diagram of an optical module heat dissipation structure disposed inside an electronic product according to an implementation manner of the present disclosure, where a structure of a heat pipe is included.

Referring to FIG. 2, in a preferred implementation manner of the present disclosure, the optical module heat dissipation structure 100 further includes a heat pipe 60, where the heat pipe 60 is embedded in the heat dissipation wall 40 and conducts heat dissipated from the optical module 10, to the enclosure 22. The disposing of the heat pipe 60 is beneficial to conducting heat to the upper housing 222 for heat dissipation, thereby improving the heat transfer efficiency.

In this implementation manner, the heat pipe 60 includes a first part 62 and a second part 64, where an insertion slot 44 is formed between the heat dissipation wall 40 and the enclosure 22, the second part 64 of the heat pipe 60 is accommodated inside the insertion slot 44, and the first part 62 of the heat pipe 60 is clamped between the optical module 10 and the heat dissipation wall 40. Combination of the second part 64 of the heat pipe 60 and the insertion slot 44 makes it easy for positioning during installation of the heat pipe 60 into the enclosure 22. During the installation, the second part 64 is first inserted into the insertion slot 44, while the first part 62 of the heat pipe 60 is made to tightly cling to the heat dissipation wall 40, and then, the optical module 10 is installed inside the enclosure 22. The heat pipe 60 is L-shaped, is made of a metal material, and is fixed to the enclosure 22 in a welding manner. The heat pipe 60 may also be fixed to the enclosure 22 in another manner such as a pipe clamp.

Figure 3:
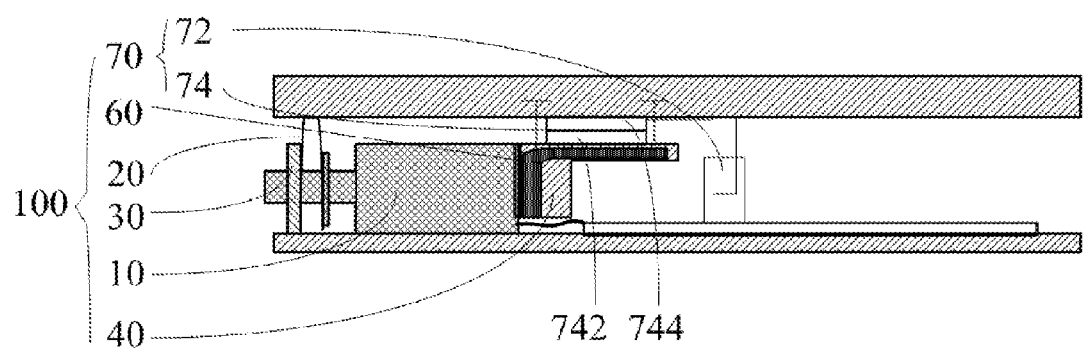
FIG. 3 is a schematic diagram of an optical module heat dissipation structure disposed inside an electronic product according to an implementation manner of the present disclosure, where structures of a heat pipe and a thermoelectric cooling module are included.

Referring to FIG. 3, in a preferred implementation manner of the present disclosure, the optical module heat dissipation structure 100 further includes a thermoelectric cooling module 70, where the thermoelectric cooling module 70 includes a control portion 72 and a chip 74, the control portion 72 is electrically connected to the circuit card 26 in the enclosure 22, the chip 74 is fixed between the heat dissipation wall 40 and the enclosure 22, and the chip 74 includes a cold side 742 and a hot side 744, where the cold side 742 is laminated to the heat dissipation wall 40, and the hot side 744 is laminated to the enclosure 22. The thermoelectric cooling module 70 can further increase a cooling temperature difference and improve the heat dissipation performance, thereby ensuring the performance and the service life of the optical module 10.

Figure 4:
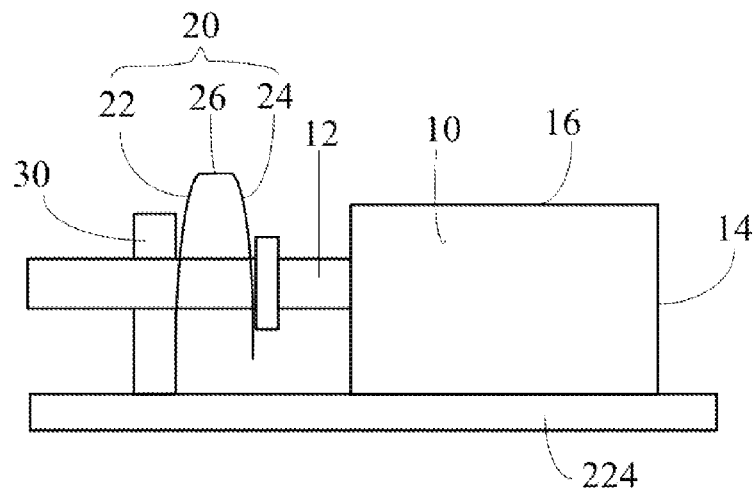
FIG. 4 is a side view of a structure that an elastic component of an optical module heat dissipation structure is connected between an optical module and a fixed wall according to an implementation manner of the present disclosure.
Figure 5:
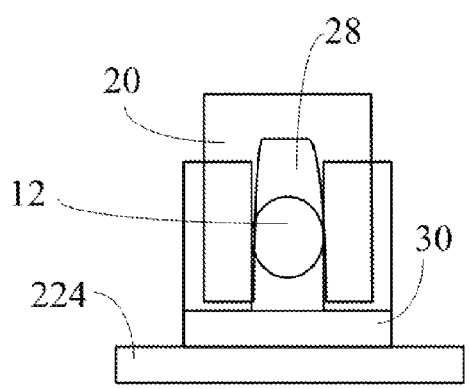
FIG. 5 is a main view of the structure shown in FIG. 4 that the elastic component is connected between the optical module and the fixed wall.

Referring to FIG. 4 and FIG. 5, in an implementation manner, the elastic component 20 is in a structure of an integrally formed elastic piece, and the elastic component 20 includes a first abutting portion 22, a second abutting portion 24, and a connection portion 26, where the connection portion 26 is connected between the first abutting portion 22 and the second abutting portion 24, the first abutting portion 22 is configured to abut against the fixed wall 30, the second abutting portion 24 is configured to abut against the optical module 10, and an open slot 28 is provided on the first abutting portion 22 and the second abutting portion 24, where the joint portion 12 is provided at a front end of the optical module 10, and the joint portion 12 is accommodated inside the open slots 28 and penetrates the fixed wall 30. An integrally formed elastic piece structure makes the elastic component 20 simple and easy to install. During installation, the joint portion 12 of the optical module 10 is inserted into the open slots 28 of the elastic component 20, that is, the positioning of the elastic component 20 is implemented.

Figure 6:
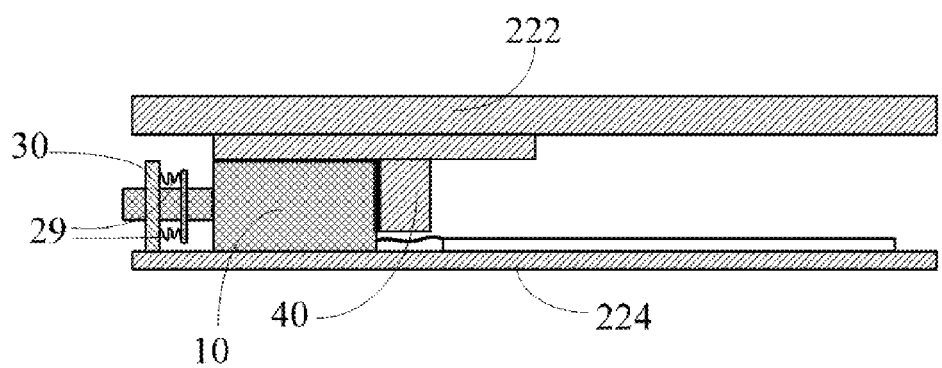
FIG. 6 is a schematic diagram of an optical module heat dissipation structure disposed inside an electronic product according to another implementation manner of the present disclosure.

Referring to FIG. 6, in another implementation manner of the present disclosure, the elastic component 20 includes a pair of springs 29, the joint portion 12 is provided at a front end of the optical module 10, the joint portion 12 penetrates the fixed wall 30, and the pair of springs 29 are symmetrically distributed on two sides of the joint portion 12. The pair of springs 29 are symmetrically distributed, such that elasticity of the elastic component 20 is stable and balanced. Two ends of the spring 29 may be fixed using screws.

The foregoing descriptions are exemplary implementation manners of the present disclosure. It should be noted that a person of ordinary skill in the art may make several improvements and polishing without departing from the principle of the present disclosure and the improvements and polishing shall fall within the protection scope of the present disclosure.

What is claimed is:

1. An optical module heat dissipation structure, disposed inside an enclosure, wherein the optical module heat dissipation structure comprises:
   an optical module;
   an elastic component;
   a fixed wall; and
   a heat dissipation wall,
   wherein the fixed wall and the heat dissipation wall are both connected to the enclosure,
   wherein the optical module is disposed between the fixed wall and the heat dissipation wall,
   wherein the elastic component elastically abuts between the fixed wall and the optical module,
   wherein elasticity of the elastic component makes the optical module cling to the heat dissipation wall, to improve the heat dissipation efficiency of the optical module heat dissipation structure, and
   wherein the optical heat dissipation structure further comprises at least one of:
      a first lamination portion coupled to a back end of the optical module, wherein the first lamination portion clings to the heat dissipation wall;
      a heat pipe, wherein the heat pipe is embedded in the heat dissipation wall and conducts heat dissipated from the optical module, to the enclosure; and
      a thermoelectric cooling module, wherein the thermoelectric cooling module comprises a control portion and a chip, wherein the control portion is electrically connected to a circuit card in the enclosure, wherein the chip is fixed between the heat dissipation wall and the enclosure, and wherein the chip comprises a cold side and a hot side, wherein the cold side is laminated to the heat dissipation wall and the hot side is laminated to the enclosure.

2. The optical module heat dissipation structure of claim 1, wherein a joint portion is provided at a front end of the optical module, and wherein the joint portion penetrates the fixed wall to extend out of the enclosure.

3. The optical module heat dissipation structure of claim 1, wherein the optical module further comprises a second lamination portion, wherein the second lamination portion clings to the enclosure.

4. The optical module heat dissipation structure of claim 1, wherein a heat conducting material is coated between the first lamination portion and the heat dissipation wall.

5. The optical module heat dissipation structure of claim 1, wherein the heat pipe comprises a first part and a second part, wherein an insertion slot is formed between the heat dissipation wall and the enclosure, wherein the second part of the heat pipe is accommodated inside the insertion slot, and wherein the first part of the heat pipe is clamped between the optical module and the heat dissipation wall.

6. The optical module heat dissipation structure of claim 5, wherein the heat pipe is L-shaped.

7. The optical module heat dissipation structure of claim 1, wherein the elastic component comprises one of a first configuration or a second configuration,
wherein the first configuration comprises: a pair of springs, wherein each of the springs presses between the fixed wall and the optical module, wherein a joint portion is provided at a front end of the optical module, wherein the joint portion penetrates the fixed wall, and wherein the pair of springs are symmetrically distributed on two sides of the joint portion, and
wherein the second configuration comprises a first abutting portion, a second abutting portion, and a connection portion, wherein the connection portion is connected between the first abutting portion and the second abutting portion, wherein the first abutting portion is configured to abut against the fixed wall, wherein the second abutting portion is configured to abut against the optical module, wherein an open slot is provided on the first abutting portion and the second abutting portion, wherein a joint portion is provided at a front end of the optical module, and wherein the joint portion is accommodated inside the open slot and penetrates the fixed wall.

8. An optical module heat dissipation structure, disposed inside an enclosure, wherein the optical module heat dissipation structure comprises:
an optical module;
an elastic component;
a fixed wall; and
a heat dissipation wall,
wherein the fixed wall and the heat dissipation wall are both connected to the enclosure,
where in the optical module is disposed between the fixed wall and the heat dissipation wall,
wherein the elastic component elastically abuts between the fixed wall and the optical module,
wherein elasticity of the elastic component makes the optical module cling to the heat dissipation wall, to improve the heat dissipation efficiency of the optical module heat dissipation structure, and
wherein the elastic component comprises a first abutting portion, a second abutting portion, and a connection portion, wherein the connection portion is connected between the first abutting portion and the second abutting portion, wherein the first abutting portion is configured to abut against the fixed wall, wherein the second abutting portion is configured to abut against the optical module, wherein an open slot is provided on the first abutting portion and the second abutting portion, wherein a joint portion is provided at a front end of the optical module, and wherein the joint portion is accommodated inside the open slots and penetrates the fixed wall.

9. An electronic product, comprising:
an enclosure; and
an optical module heat dissipation structure disposed inside the enclosure,
wherein the optical module heat dissipation structure comprises an optical module, an elastic component, a fixed wall, and a heat dissipation wall,
wherein the fixed wall and the heat dissipation wall are both connected to the enclosure,
wherein the optical module is disposed between the fixed wall and the heat dissipation wall,
wherein the elastic component elastically abuts between the fixed wall and the optical module,
wherein elasticity of the elastic component makes the optical module cling to the heat dissipation wall, to improve the heat dissipation efficiency of the optical module heat dissipation structure, and
wherein the optical heat dissipation structure further comprises at least one of:
a first lamination portion coupled to a back end of the optical module, wherein the first lamination portion clings to the heat dissipation wall;
a heat pipe, wherein the heat pipe is embedded in the heat dissipation wall and conducts heat dissipated from the optical module, to the enclosure; and
a thermoelectric cooling module, wherein the thermoelectric cooling module comprises a control portion and a chip, wherein the control portion is electrically connected to a circuit card in the enclosure, wherein the chip is fixed between the heat dissipation wall and the enclosure, and wherein the chip comprises a cold side and a hot side, wherein the cold side is laminated to the heat dissipation wall and the hot side is laminated to the enclosure.

10. The electronic product of claim 9, wherein a joint portion is provided at a front end of the optical module, and wherein the joint portion penetrates the fixed wall to extend out of the enclosure.

11. The electronic product of claim 9, wherein the optical module further comprises a second lamination portion, wherein the second lamination portion clings to the enclosure.

12. The electronic product of claim 9, wherein a heat conducting material is coated between the first lamination portion and the heat dissipation wall.

13. The electronic product of claim 9, wherein the heat pipe comprises a first part and a second part, wherein an insertion slot is formed between the heat dissipation wall and the enclosure, wherein the second part of the heat pipe is accommodated inside the insertion slot, and wherein the first part of the heat pipe is clamped between the optical module and the heat dissipation wall.

14. The electronic product of claim 9, wherein the heat pipe is L-shaped.

15. The electronic product of claim 9, wherein the elastic component comprises a first abutting portion, a second abutting portion, and a connection portion, wherein the connection portion is connected between the first abutting portion and the second abutting portion, wherein the first abutting portion is configured to abut against the fixed wall, wherein the second abutting portion is configured to abut against the optical module, wherein an open slot is provided on the first abutting portion and the second abutting portion, wherein a joint portion is provided at a front end of the optical module, and wherein the joint portion is accommodated inside the open slots and penetrates the fixed wall.

16. The electronic product of claim 9, wherein the elastic component comprises a pair of springs, wherein each of the springs presses between the fixed wall and the optical module, wherein a joint portion is provided at a front end of the optical module, wherein the joint portion penetrates the fixed wall, and wherein the pair of springs are symmetrically distributed on two sides of the joint portion.

* * * * *

UNITED STATES PATENT AND TRADEMARK OFFICE
CERTIFICATE OF CORRECTION

PATENT NO. : 9,739,960 B2
APPLICATION NO. : 14/980458
DATED : August 22, 2017
INVENTOR(S) : Shuliang Huang, Zaomeng Liu and Liqian Zhai Page 1 of 1

It is certified that error appears in the above-identified patent and that said Letters Patent is hereby corrected as shown below:

On the Title Page

Page 2, Item (56) References Cited, Other Publications should read:
Foreign Communication From A Counterpart Application, Chinese Application No. 2013105892829, Chinese Office Action dated September 27, 2016, 5 pages.

Signed and Sealed this
Twenty-fourth Day of October, 2017

Joseph Matal
*Performing the Functions and Duties of the*
*Under Secretary of Commerce for Intellectual Property and*
*Director of the United States Patent and Trademark Office*